United States Patent
Case et al.

(10) Patent No.: US 6,694,489 B1
(45) Date of Patent: Feb. 17, 2004

(54) TEST INTERFACE FOR A CONFIGURABLE SYSTEM ON-CHIP

(75) Inventors: Jerry Case, San Jose, CA (US); Jean-Didier Allegrucci, Sunnyvale, CA (US)

(73) Assignee: Triscend Corporation, Mountain View, CA (US)

( * ) Notice: Subject to any disclaimer, the term of this patent is extended or adjusted under 35 U.S.C. 154(b) by 525 days.

(21) Appl. No.: 09/649,101

(22) Filed: Aug. 23, 2000

(51) Int. Cl.$^7$ .............................................. G06F 17/50
(52) U.S. Cl. ................. 716/1; 712/36; 716/2; 716/17; 716/18
(58) Field of Search ........................ 702/117; 370/463; 716/1, 2, 17, 18; 712/36

(56) References Cited

U.S. PATENT DOCUMENTS

| | | | | |
|---|---|---|---|---|
| 5,299,193 A | * | 3/1994 | Szczepanek | ................ 370/463 |
| 6,055,619 A | * | 4/2000 | North et al. | .................. 712/36 |
| 6,522,985 B1 | * | 2/2003 | Swoboda et al. | ........... 702/117 |

FOREIGN PATENT DOCUMENTS

WO    WO 00/22546    4/2000

OTHER PUBLICATIONS

IEEE Standard Test Access Port and Boundary–Scan Architecture, IEEE Computer Society, Sponsored by the Test Technology Standards Committee, published by the Institute of Electrical and Electronics Engineers, Inc., 345 East 47$^{th}$ Street, New York, NY 10017, USA, Oct. 21, 1993; 166 pp.

Supplement to IEEE Std 1149, 1–1990, IEEE Standard Test Access Port and Boundary–Scan Architecture, IEEE Computer Society, Sponsored by the Test Technology Standards Committee, published by the Institute of Electrical and Electronics Engineers, Inc. 345 East 47$^{th}$ Street, New York, NY 10017, USA Mar. 1, 1995; 75 pp.

* cited by examiner

*Primary Examiner*—Matthew Smith
*Assistant Examiner*—Thuan Do
(74) *Attorney, Agent, or Firm*—Blakely, Sokoloff, Taylor & Zafman LLP

(57) ABSTRACT

A method of communicating with a configurable system-on-chip via a test interface is described. First, an interface is coupled to a configurable system-on-chip and a first command is sent to the interface from a tester. The next command execution is then blocked. Next, the first command is executed in the configurable system-on-chip. Data is then output from the configurable system-on-chip and written to a register in the interface. The data output includes a ready bit. Next, the data from the register is read. The first bit read is an asserted ready bit. The next command execution is then enabled. When the asserted ready bit is received in the tester, the tester sends a second command to the interface. The second command is then executed in the configurable system-on-a-chip.

34 Claims, 6 Drawing Sheets

TEST INTERFACE FOR A CONFIGURABLE SYSTEM ON-CHIP

FIELD OF THE INVENTION

The present invention relates to integrated circuits and more specifically to a improved test interface on a configurable processor system.

BACKGROUND OF THE INVENTION

The Joint Test Action Group (JTAG) interface provides access to a configurable system-on-chip for test and debugging functions. The JTAG interface is a serial port, which can be connected to a monitoring/test computer via a serial cable. FIG. 1 illustrates an IEEE 1149.1 specification JTAG interface 100. Test data is input at the test data input (TDI) 110. Three registers are connected in parallel: The bypass register 120 is a single bit register and passes data directly from the TDI 110 to the test data output (TDO) multiplexer 150. The boundary scan register 130 provides the capability to scan or place data on every I/O pin of the configurable system-on-chip being tested. The instruction register 140 provides the instruction to select one register to be connected between the TDI 110 and TDO 150.

IEEE 1149.1 specification defines the standard, basic functions of the JTAG interface. The IEEE 1149.1 specification requires only the boundary scan register, the bypass register and the instruction register. The IEEE 1149.1 specification is hereby incorporated by reference in its entirety, for all purposes. The IEEE 1149.1 specification interface provides only limited utility in and of itself. To provide additional utility, the IEEE 1149.1 specification also allows proprietary extensions or additional capabilities as long as the basic IEEE 1149.1 specification remains supported.

A computer configurable system-on-chip 200 block diagram of one example of an extended, proprietary JTAG incorporating an extended JTAG interface is illustrated in FIG. 2. The JTAG 205 provides a dedicated, four-pin serial interface 208 with many uses. The JTAG unit 205 can access all addressable system resources by becoming the bus master on the internal CSI bus 260. Serving as a bus master, the JTAG unit 205 converts serial bit streams into parallel registers whose contents are placed on the address, data and command buses to emulate CSI bus transactions. The JTAG unit 205 can also directly accesses internal CPU 220 registers and CSL 215 configuration data with visibility to functions not accessible from application programs.

FIG. 2 shows the JTAG as a bus master. A multi-master/multi slave internal system bus 260 connects to several building blocks including a CPU 220, DMA unit 240, memory devices 230, and peripherals. The JTAG unit 205, as a bus master, is capable of requesting a bus access. When the JTAG unit 205 gains control over the internal bus 260, it is capable of accessing any addressable element connected on the system. A detailed description of the operation of the JTAG unit 205 is provided in Winegarden et al., PCT application WO 00/22546. PCT application WO 00/22546 is hereby incorporated by reference for all purposes.

A computer 210 acting as an external tester/debugger can interface with the CPSU device 200 via the JTAG interface 205, using a cable connected between the computer and the target board as shown in FIG. 2.

The JTAG unit 205 can serve as a bus slave when interacting with the DMA unit 240. First the JTAG unit 205 becomes master on the CSI bus 260, programs the DMA unit 240 to transfer data to or from the JTAG unit 205, and then relinquishes the CSI bus 260 to the DMA unit 240. After configuring the DMA unit 240, the JTAG unit 205 interfaces with the DMA unit 240 as a slave device using the DMA unit's 240 request and acknowledge signals. Unfortunately, using the DMA unit 240 in this manner conflicts with many software functions that may be running on the system 200 being tested. This requires users to modify their software to work around this use of the DMA 240.

FIG. 3 illustrates a block diagram of the JTAG 205 internal components. The IEEE 1149.1 specification is supported through the 1-bit bypass register 305, the boundary scan register 310, the 4-bit instruction register 320, TDI 380, multiplexer 390 and TDO 395. Additional registers include: The device identification (ID) register 330 is a 32 bit register for storing a manufacturer's identification information such as part number, serial number, software revision number, etc. The master register 340 provides several proprietary data transfer functions, which are described in more detail below. The bustat register 350 is an 11-bit register that captures various proprietary status signals from different parts of the configurable system-on-chip being tested. The DMADAT register 360 is a 9-bit register that provides data transfer to and from the DMA unit 240 when the JTAG 205 asserts control over the DMA unit 240. The scan chain register 370 applies and captures internal scan patterns during a manufacturing test.

The master register 340 provides several functions. The master register 340 can transfer any one of five different lengths of data, depending on the instruction. First, in a Mwrite_long instruction, during a capture state, master register 340 captures 41 bits from the configurable system-on-chip under test. During a subsequent shift state, the 41 bits plus a MwL_READY bit are shifted out to the TDO 395. The MwL_READY bit is the first bit shifted out. Second, in a Mwrite instruction, during a capture state, master register 340 captures 25 bits from the configurable system-on-chip under test. During a subsequent shift state, the 25 bits plus a Mw_READY bit are shifted out to the TDO 395. The Mw_READY bit is the first bit shifted out. Third, in a Mread_long instruction, during a capture state, master register 340 captures 41 bits from the TDI 380. During a subsequent shift state, the 41 bits are shifted out to the configurable system-on-chip under test. Fourth, in a Mread instruction, during a capture state, master register 340 captures 25 bits from the TDI 380. During a subsequent shift state, the 25 bits are shifted out to the configurable system-on-chip under test. Fifth, in a Mverify instruction, during a capture state, master register 340 captures 9 bits from the configurable system-on-chip under test. During a subsequent shift state, the 9 bits plus a Mv_READY bit are shifted out to the TDO 395. The Mv_READY bit is the first bit shifted out.

In each master register 340 instruction the precise corresponding number of bits in the bit chain must be shifted into or out of the master register 340 to shift useable data into or out of the master register 340. This precise requirement of bit chain length is referred to as continuous write-in or read-out during the Mwrite_long, Mwrite, and Mverify instructions the corresponding READY bit (MwL_READY, Mw_READY and Mv_READY, respectively) is the first bit shifted out of the master register 340. The READY bit indicates that the previous master-bus operation has been successfully completed and the data represents the results of the previous master-bus operation. The READY bit is used by the tester/debugger 210 to confirm that the previous master-bus operation had occurred. If the tester/debugger 210 does not receive a valid READY bit, then the tester/debugger 210 disregards the data received and resends the previous master-bus instruction. Because the READY bit determines the validity of the data received by the tester/debugger 210, it is very important that the READY bit be accurately transferred to the tester/debugger 210 so as to reduce the occurrence of resending the previous master-bus instruction and resulting data.

The serial interface between the tester/debugger 210 and the JTAG 205 is limited to approximately 100 kHz. The excessive instruction and resulting data resends consume excessive bandwidth in the serial interface between the JTAG 205 and the external tester/debugger 210. The excessive instruction and resulting data resends cause additional time delays in testing the configurable system-on-chip. Further, a READY bit was included in only a few of the data chains and even when included was often lost or improperly transferred to the tester/debugger. The lost or improperly transferred READY bit resulted in excessive bit chain resends and overall slower test/debug operation. Further, the continuous write-in/read-out nature of the prior art further slowed the test/debug operation by consuming excessive machine cycles and time for data transfer. Further still, the READY bit is more likely to be lost if a difference exists between the clock speed of the configurable system-on-chip under test and the clock speed of the tester/debugger because the ready bit was not sampled internally to the device under test to determine if the tester has received a correct value of the READY bit.

SUMMARY OF THE INVENTION

A method of communicating with a configurable system-on-chip via a test interface is described. First, an interface is coupled to a configurable system-on-chip and a first command is sent to the interface from a tester. The next command execution is then blocked. Next, the first command is executed in the configurable system-on-chip. Data is then output from the configurable system-on-chip and written to a register in the interface. The data output includes a ready bit. Next, the data from the register is read. The first bit read is an asserted ready bit. The next command execution is then enabled. When the asserted ready bit is received in the tester, the tester sends a second command to the interface. The second command is then executed in the computer configurable system-on-a-chip.

Other features and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings in which like references indicate similar elements.

DETAILED DESCRIPTION

As will be described in more detail below, a method of communicating with a configurable system-on-chip via a test interface is described. First, an interface is coupled to a configurable system-on-chip and a first command is sent to the interface from a tester. The next command execution is then blocked. Next, the first command is executed in the configurable system-on-chip. Data is then output from the configurable system-on-chip and written to a register in the interface. The data output includes a ready bit. Next, the data from the register is read. The first bit read is an asserted ready bit. The next command execution is then enabled. When the asserted ready bit is received in the tester, the tester sends a second command to the interface. The second command is then executed in the configurable system-on-a-chip.

An intended advantage of one embodiment is to reduce the data resends between the test interface and the tester. Another intended advantage of a second embodiment is to allow a single status bit to be shifted out of the interface. Yet another intended advantage is to calculate a continuous data check sum. Still another intended advantage is to reduce use of the DMA unit during testing.

Figure 1:
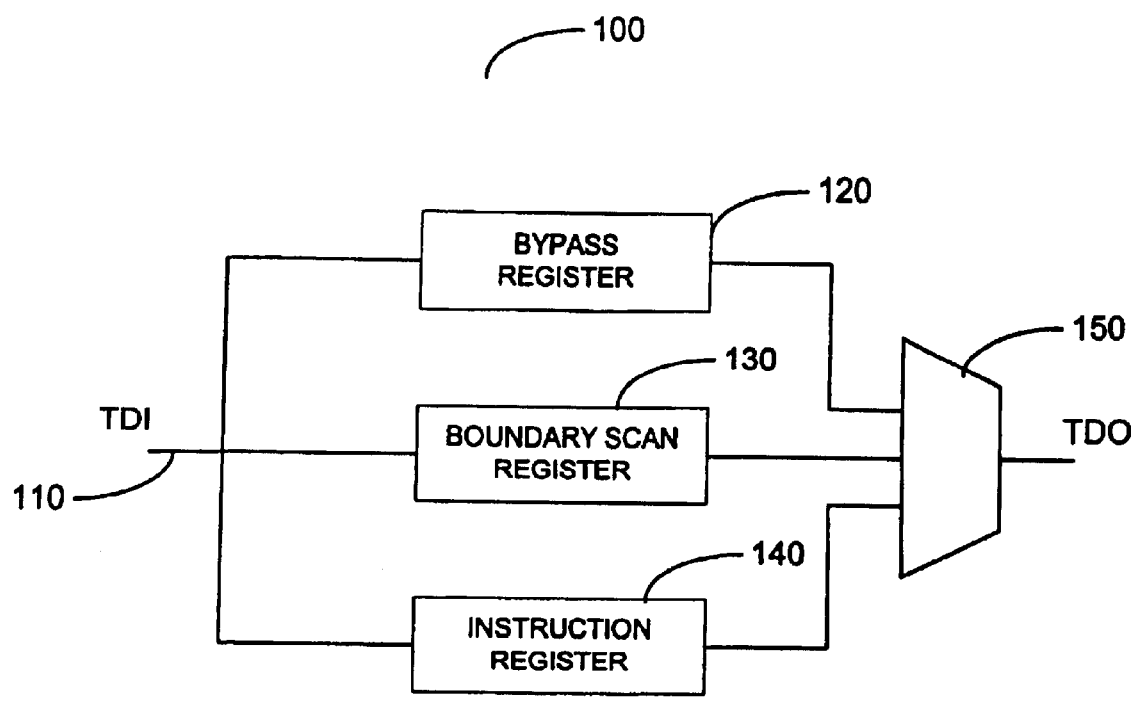
FIG. 1 illustrates a block diagram of a prior art test interface.
Figure 2:
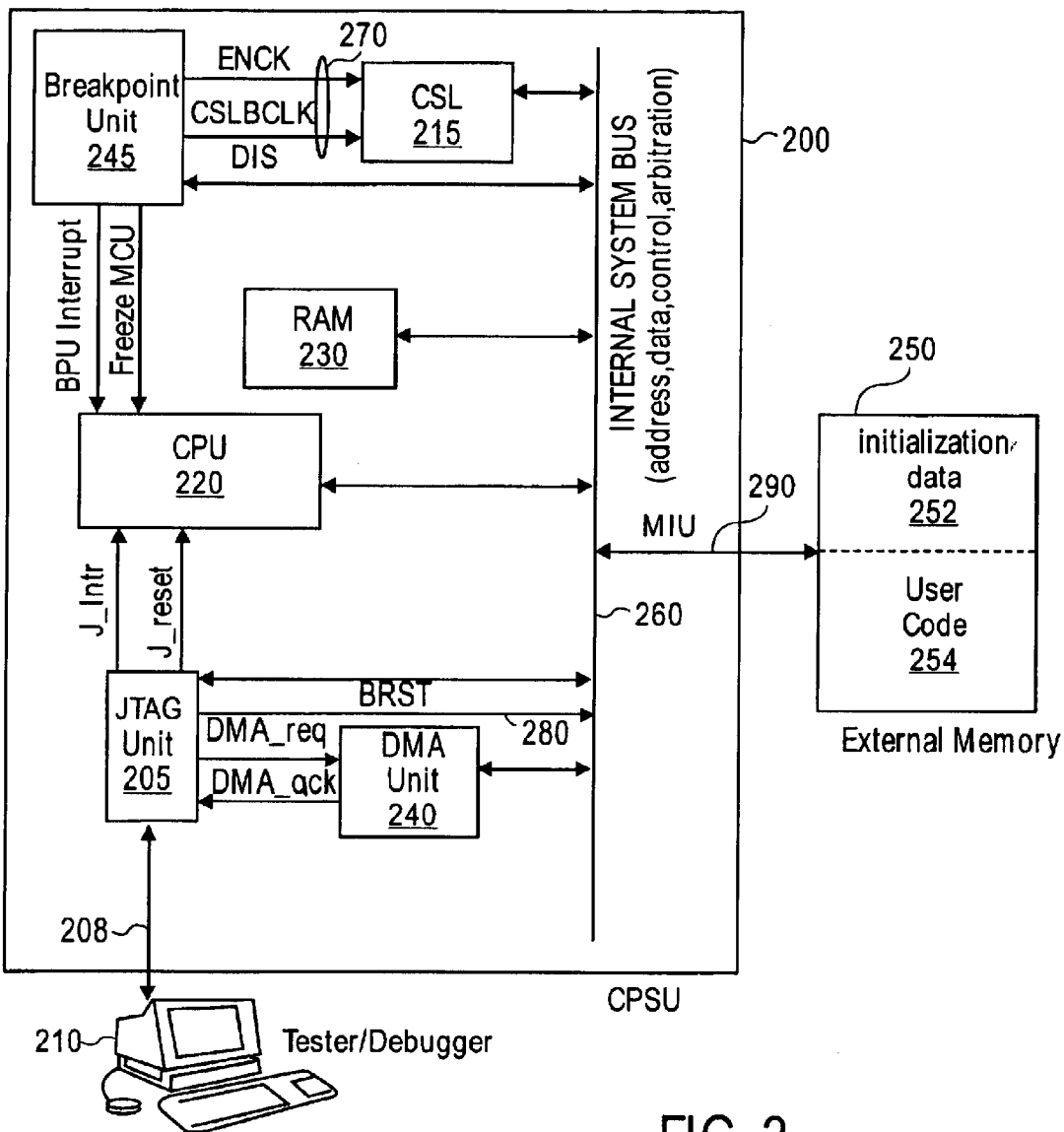
FIG. 2 illustrates a block diagram of a prior art test interface coupled to a computer system.
Figure 3:
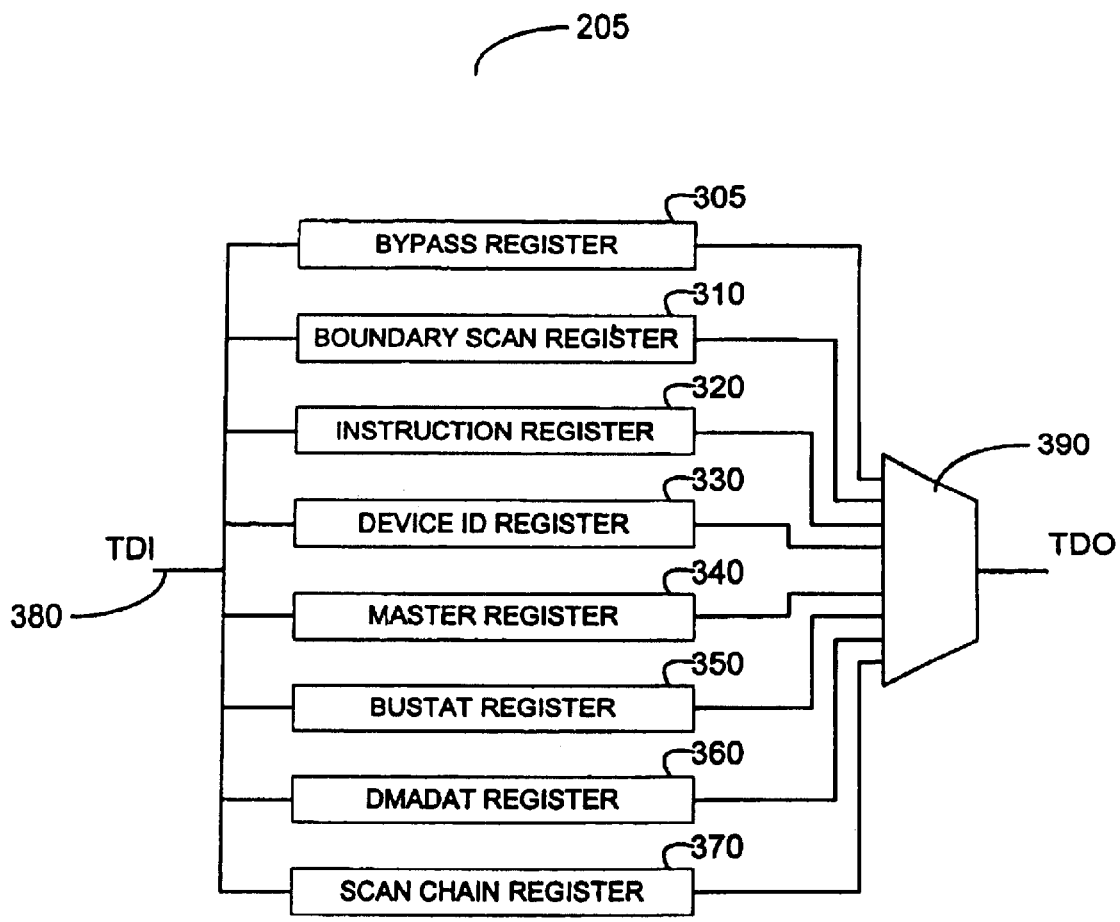
FIG. 3 illustrates a block diagram of a prior art test interface.
Figure 4:
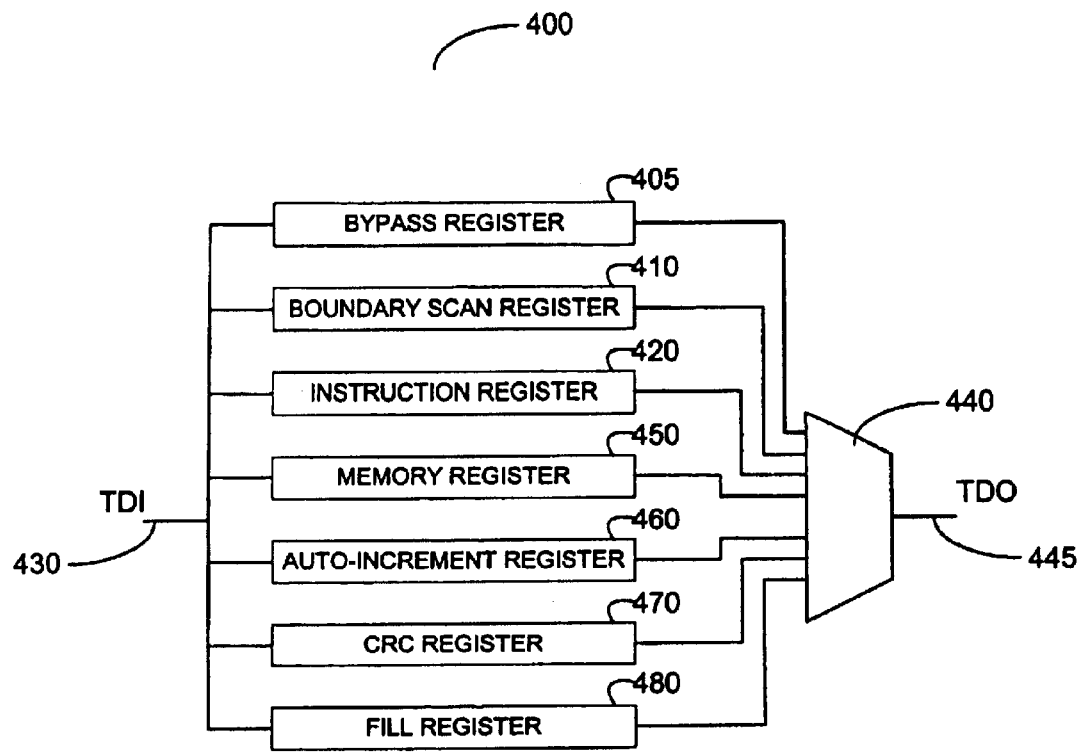
FIG. 4 illustrates a block diagram of a test interface in accordance with one embodiment.

FIG. 4 illustrates a test interface unit 400 in accordance with one embodiment of the present invention. The IEEE 1149.1 specification is supported through the 1-bit bypass register 405, the boundary scan register 410, the 4-bit instruction register 420, TDI 430, multiplexer 440 and TDO 445. Additional registers include: The memory register 450 is a 68-bit register. The memory auto-increment register 460 is a 34-bit register. The cyclic redundancy check (CRC) register 470, a 32-bit register. The memory fill register 480 is a 96-bit register. As will be explained in more detail below, the registers could be larger or smaller.

According to one embodiment of the present invention, a READY bit is added to each of the data chains output from the interface. According to another embodiment of the present invention, the clock speeds are "synchronized" so as to reduce the losses of the READY bit. For yet another alternative embodiment, only 1 bit must be transferred into an interface register to shift out the READY bit from the register.

Figure 5:
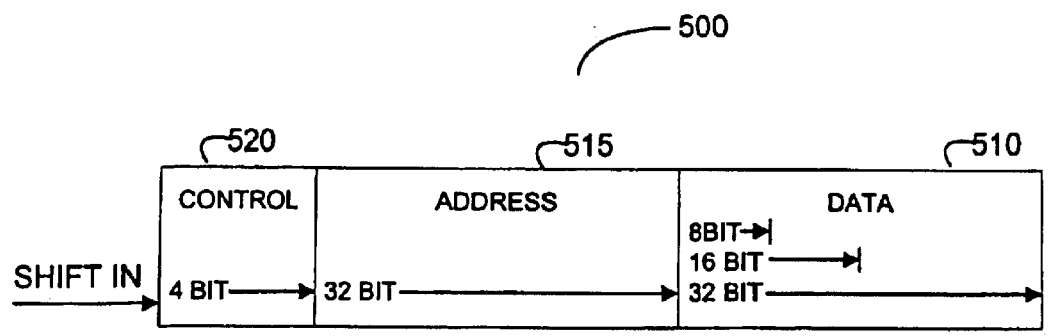
FIGS. 5 and 5A show data chains in accordance with one embodiment.
Figure 5A:
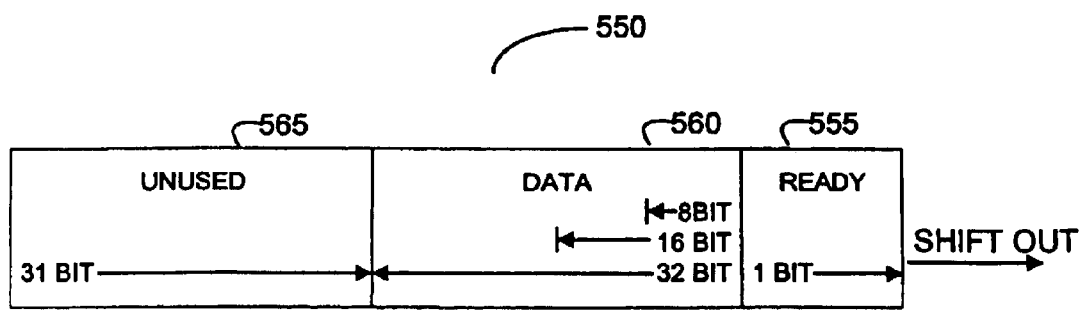

For one embodiment, the memory read/write chain is used to perform memory transfers over the CSI bus. According to one embodiment of the present invention, the memory read/write chain is a 68-bit register as shown in FIGS. 5 and 5A. FIG. 5 illustrates the 68-bit data chain 500 for new commands shifted into or written into the memory register. The 68-bit data chain 500 includes, in order shifted into the register: First, a 32 bit data segment or field 510, bits 0–31. Second, a 32-bit address segment 515, bits 32–63. Third a 4-bit control segment 520, bits 64–67. The data size contained in the data segment 510 can be variable, including 8 bit, 16 bit or 32 bit data. If the data size is less than 32 bits, the data is left justified within the data segment 510 such that an 8-bit data would be in bits 24–31, a 16-bit data would be in bits 16–31. Any unused portion of the data segment 510 is ignored. The variable length of data segment 510 allows fewer bits to be shifted into the memory register i.e. the entire register capacity is not required to be shifted in. For a Memory Write, only 8 bits of data need to be shifted in for 8-bit data, 16 bits of data need to be shifted in for 16-bit data, and 32 bits of data need to be shifted in for 32-bit data. For a Memory Read, no data bits need to be shifted into the interface. For a Memory Read, only 8 bits of data need to be shifted out for 8-bit data, and 16 bits of data need to be shifted out for 16-bit data. No data bits need to be shifted out of the device for a Memory Write. This saves 24-bit-shifts in the 8-bit data case, and 16 bit-shifts in the 16-bit data case.

FIG. 5A illustrates the 68-bit data chain 550 read out of the memory register. This 68-bit data chain 550 includes, in order shifted out of the memory register: First, a READY bit 555 in bit 0. Second, a 32-bit data segment 560 in bits 1–32. Third, a 31-bit segment 565, which is ignored bits in bits 33–67. The data size contained in the data segment 560 can be variable including 8 bit, 16 bit or 32 bit data. If the data size is less than 32 bits, the data is right justified within the data segment 560 such that an 8-bit data would be in bits 1–8, a 16-bit data would be in bits 1–16. Any unused portion of the data segment 560 is ignored. The variable length of the data size contained in the data segment 560 reduces the number of bits that must be transferred to and from the tester/debugger and thereby increase efficiency of the use of the serial connection.

For one embodiment, a single scan chain is used for memory read/write. The memory scan chain has a variable length shift, ranging from one bit to the maximum supported data size. Only one bit is required to be shifted if the data is not ready. Sizes smaller than the maximum supported data size can be shifted in or out of the register without having to shift the bits in the unused portion of the variable length shift.

According to one alternative embodiment, a capture-dr state captures the current state of the read/write status register. During a shift-dr state the captured data is shifted out and a new command is shifted in. During an update-dr state, the new command is executed, if the previous command was successfully completed.

The read address pointer as used in the auto-increment command, is updated in the update-dr state with the shifted in read address incremented by the size of the current data. The write address pointer as used in the auto-increment command is updated in the update-dr state with shifted in write address incremented by the size of the current data. All address bits 31 to 0 are shifted in and updated.

The shifted in command bits are described below.

TABLE 1

| Bit | Read shift in | Write shift in |
| --- | --- | --- |
| 67 | EXECUTE | EXECUTE |
| 66 | read/write (0) | read/write (1) |
| 65–64 | size | size |
| 63–32 | address | address |
| 31–0 | ignored | data |

Read shift in command:
EXECUTE—Execute interface command on update-dr
read/write—Selects read or write command
size—Selects word (2), half word (1), or byte (0)
address—32-bit memory address
ignored—Value is ignored
Write shift in command:
EXECUTE—Execute interface command on update-dr
read/write—Selects read or write command
size—Selects word (2), half word (1), or byte (0)
address—32-bit memory address
data—32-bit data word
NOTE: the write data is always left-aligned: bits 31–24 contain the 8-bit for byte writes, bits 31–16 contain the half-word for 16-bit transactions. The shifted out status bits are described below.

TABLE 2

| Bit | Previous read shift out | Previous write shift out |
| --- | --- | --- |
| 67–33 | undefined | undefined |
| 32–1 | data | undefined |
| 0 | READY | READY |

Previous read shift out status:
undefined—Undefined
data—32-bit data word
READY—Previous read/write operation has been successfully completed; Read data is valid.
Previous write shift out status:
undefined—Undefined
READY—Previous read/write operation has been successfully completed.

For an alternative embodiment, the memory read/write, memory auto-increment read/write, and memory fill commands share a common handshake process. The final bit to be shifted into the register, the EXECUTE bit, indicates whether the shifted-in information is to be executed as a command. The EXECUTE bit, when not set, allows status information to be shifted out of the register. A READY bit is the first bit to be shifted out of the register. The READY bit, indicates whether the previous command has completed and valid data can be shifted out of the register in this cycle. Further, when the READY bit is not valid i.e. not set to READY status, then any incoming memory command is blocked. The READY bit status can be used to indicate when a command has been accepted by the device under test i.e. such as a configurable system-on-chip.

On a read, the READY bit indicates the read data is valid. The current read command shifted in will be executed on update-dr. The current memory command (i.e. memory read/write, memory auto-increment read/write, or memory fill) shifted in will be ignored or blocked if the previous read command data has not yet returned. If there is no previous read command, then READY should be ignored.

For a further embodiment, the READY bit is the first bit shifted out and any number of bits can be shifted out at one time, therefore, a single bit, the READY bit, can be shifted out of the register to determine if the previous command has completed. When a valid READY bit is received, then a full bit chain such as a new command is then shifted into the memory register and the previous command can be shifted out of the register. This embodiment reduces the number of shifts required to retrieve a status of the information in the register to only one bit. For example, according to an embodiment where the Memory Read/Write command is 68 bits, 67 bit-shifts are saved, when the previous command has not yet completed. This process is much more efficient over the prior art as only one bit must be shifted into the register to retrieve the READY bit rather than shifting an entire bit chain.

Figure 6:
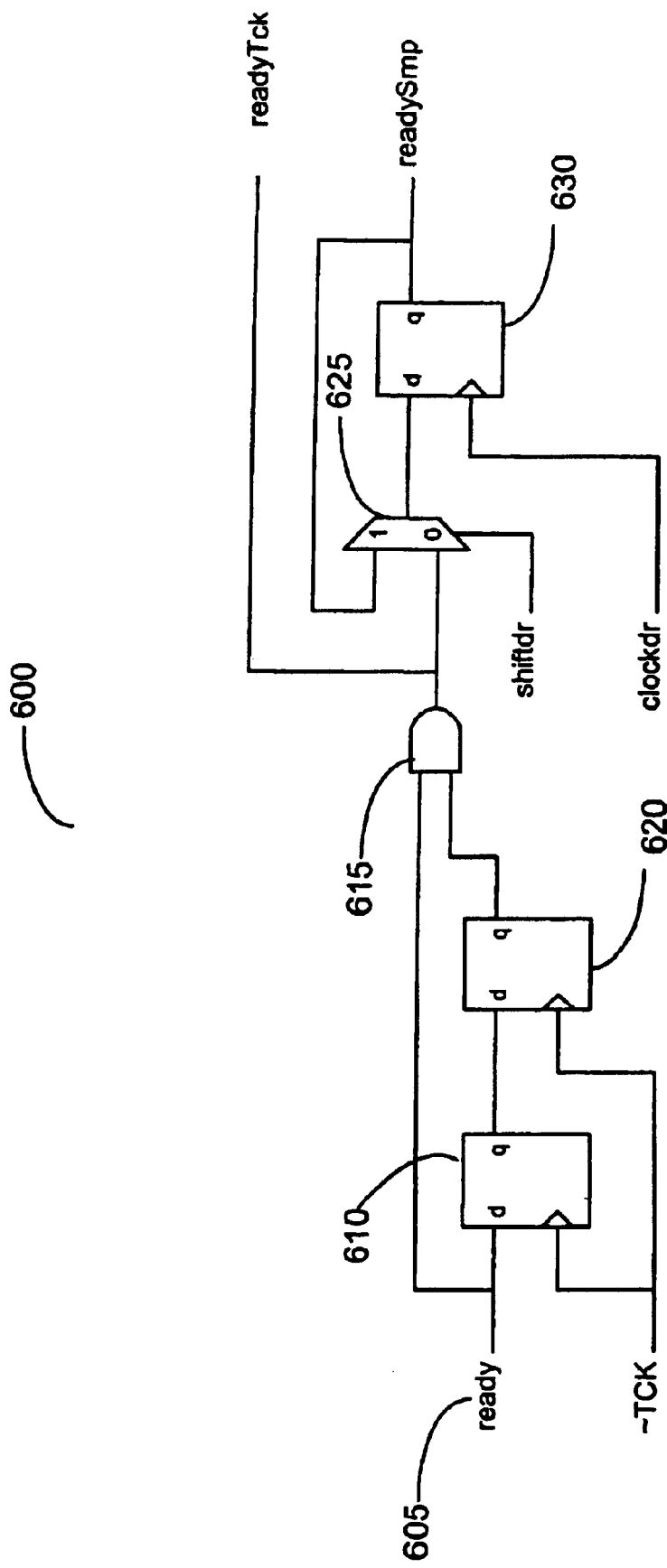
FIG. 6 shows a block diagram of a READY-bit synchronization in accordance with one embodiment.

FIG. 6 illustrates a logical block diagram 600 of one embodiment of the generation of the READY bit. The READY bit is generated by the configurable system-on-chip under test when the previous command has been completed and is applied to the first flip-flop 510 and the AND gate 615. Tester clock, ~TCK, causes the READY bit to be shifted to the second flip-flop 620. The second flip-flop 620 couples the READY bit to the second leg of the AND gate 615. The AND gate 615 then couples the READY bit to the mutiplexer 625. The mutiplexer 625 couples the READY bit to the third flip-flop 630. Clockdr is the tester clock ~TCK gated to only clock while in shift mode. Clockdr causes the READY bit to be shifted out to the tester/debugger and enables the command portion of the register. Before the READY bit is shifted to the tester/debugger, the next command is blocked or disabled. This ensures that, even where the clock of the tester/debugger and the bus clock are not the same, the READY bit is accurately transferred from the configurable system-on-chip under test to the tester/debugger. Further, until the READY bit is read by the tester/debugger and then also read or sampled by the interface, the register block any new commands, thereby preserving the current data in the register. This embodiment allows any ratio of tester clock and internal configurable system-on-chip clock of a configurable system-on-chip to be supported. The READY bit is reset as soon as a command request is generated following the rising edge of the interface update clock, eliminating false ready indications. The READY bit reset also blocks any new commands.

For an alternative embodiment, an execution of a memory read/write command or memory auto-increment command, is blocked until the tester reads the asserted data READY bit and the interface then reads the READY bit that the tester read. This embodiment prevents the READY bit being set during a shift of a new command into the register. This embodiment also prevents the tester from receiving a NOT READY bit and the new execution being received and executed.

According to yet another embodiment, a memory auto-increment read/write command reduces the amount of bit-shifts required to perform multiple memory reads or writes by using an internal address pointer from the previous memory read/write command. The auto-increment data size is also set at the same time. The address pointer is incremented by the current data size whenever the internal system bus is granted to the interface internal system bus master.

For one embodiment, the memory auto-increment register is used to perform burst memory transfers over the CSI bus. This command uses the contents of the read/write address pointers as the address for the read/write transfer. For another embodiment, the auto-increment register is a 34-bit register and the data size is the same as the last memory read/write instruction. The capture-dr state captures the current state of the read/write status register. During the shift-dr state the captured data is shifted out and the new command is shifted in. During the update-dr state the new command is executed, if the previous command successfully completed.

The read address pointer is updated in the update-dr state with the current read address incremented by the size. The write address pointer is updated in the update-dr state with the current write address incremented by the size. All address bits 31 to 0 are updated.

The shifted in command bits are described below.

TABLE 3

| Bit | Read shift in | Write shift in |
| --- | --- | --- |
| 33 | EXECUTE | EXECUTE |
| 32 | read/write (0) | read/write (1) |
| 31–0 | ignored | data |

Read shift in command:
EXECUTE—Execute interface command on update-dr
read/write—Selects read or write command
ignored—Value is ignored
Write shift in command:
EXECUTE—Execute interface command on update-dr
read/write—Selects read or write command
data 32-bit data word
NOTE: the write data is always left-aligned: bits 31–24 contains the 8-bit for byte writes, bits 31–16 contains the half-word for 16-bit transactions.

The shifted out status bits are described below.

TABLE 4

| Bit | Previous read shift out | Previous write shift out |
| --- | --- | --- |
| 33 | undefined | undefined |
| 32–1 | data | undefined |
| 0 | READY | READY |

Previous read shift out status:
undefined—Undefined
data—32-bit data word
READY—Previous read/write operation has been successfully completed; Read data is valid
Previous write shift out status:
undefined—Undefined
READY—Previous read/write operation has been successfully completed On a previous write, READY will return 0 only when the previous INTERFACE write has not yet been executed. The current memory command (i.e. memory read/write, memory auto-increment read/write, or memory fill) shifted in will be ignored if the previous write command did not yet complete. This should only occur if the bus clock is much slower than the interface clock.

On a read, READY indicates the read data is valid. The current read command shifted in will be executed on update-dr. The current memory command (i.e. memory read/write, memory auto-increment read/write, or memory fill) shifted in will be ignored or blocked if the previous read command data has not yet returned. If there is no previous read command, then READY should be ignored.

The prior art performed some of the functions of the auto-increment register such as a burst memory transfer, using the DMA. An auto-increment register in accordance with an embodiment of the present invention reduces the usage of the DMA and thereby reduces the user modifications and specialty software required.

For another embodiment, a memory auto-increment scan chain has a variable length shift for the data. The memory auto-increment scan chain generates the address by incrementing an internal address pointer. The previous memory read/write scan chain sets the internal address pointer. The address is then incremented by the data size of the variable length shift, auto-increment scan chain. According to one embodiment, the variable length data size can be 8, 16 or 32 bits. According to alternative embodiments other data sizes can also be used.

According to one embodiment, the memory fill register is used to fill a region of memory with a constant value from a start address to an end address inclusive. The start address, end address and constant value are all specified by shifting the data into the memory fill register, with the EXECUTE bit set. The READY bit is cleared when the command request is generated and set when the constant value is written into the end address. This operation was accomplished in the prior art by use of the DMA controller. A memory fill register in accordance with one embodiment of the present invention reduces the usage of the DMA controller. Reduced use of the DMA reduces the user modifications and specialty software required.

The shifted in command bits are described below.

TABLE 5

| Bit | Shift in |
| --- | --- |
| 96 | EXECUTE |
| 95–64 | start address |
| 63–32 | end address |
| 31–0 | 32-bit data |

EXECUTE—Execute interface command on update-dr start address—32-bit memory starting address end address—32-bit memory ending address data—32-bit data word The start address specifies the bottom starting address for the fill command. The end address specifies the top ending address for the fill command. The data word is the value written to the specified region of memory. The address counter is loaded with the start address, data is written to the address, and then the address is incremented by 4. The process stops after data is written to the end address.

The shifted out status bits are described below.

TABLE 6

| Bit | Shift out |
| --- | --- |
| 96–1 | undefined |
| 0 | fill done | undefined—Undefined fill done—Previous fill operation has been successfully completed The capture-dr state captures the current state of the status register. During the shift-dr state the captured data is shifted out and the new command is shifted in. During the update-dr state the new command is executed, if the previous fill command successfully completed. To check the status of the current fill command, software can shift a single zero into the memory fill register, and the fill done status bit will be shifted out. Note, this same technique can be used for any scan chain which has the desired status bit as the LSB, and the command execute bit as the MSB.

According to another embodiment, a memory read/write register and a memory auto-increment read/write register, share a common cyclic redundancy check (CRC) process. The CRC process verifies the integrity of data along the interface connection. The interface connection is typically coupled to a tester/ debugger hosting the debug software.

According to one embodiment, control bits for the CRC command include CRC Enable and CRC Direction. The CRC Direction selects either read data or write data for the CRC calculation. The CRC Enable, selects either all read data or all write data, as selected by the CRC Direction command, passing through the memory read/write and memory auto-increment read/write commands to be included in the CRC calculation.

For one embodiment, the CRC is calculated based on the data in the read/write commands. The CRC module uses the 32-bit CRC-CCITT polynomial:

$$X^{32}+x^{26}+x^{23}+x^{22}+x^{16}+x^{12}+x^{11}+x^{10}+x^{8}+x^{7}+x^{5}+x^{4}+x^{2}+x+1 \quad \text{Equation 1}$$

According to one embodiment, the CRC sub-module can compute either a read CRC or a write CRC. The same scan chain can be used for read data or write data. One bit in the scan chain selects the mode of operation. When selected for read operation, any memory read command affects the CRC value. When selected for write operation, any memory write, except for memory fill, command affects the CRC value. Writing a 1 to the enable bit of the CRC control register resets the appropriate CRC to $-1$ (two's complement). At the end of a transfer, the CRC value can be compared with an independently calculated CRC to determine the validity of the data.

According to one embodiment, the CRC is a 32-bit register is used to control the CRC sub-module. The capture-dr state captures the current state of the status register. During the shift-dr state the captured data is shifted out and the new command is shifted in. During the update-dr state the enable and clear bits are updated.

The shifted in command bits are described below.

TABLE 7

| Bit | Shift in |
| --- | --- |
| 31 | Enable |
| 30 | Clear |
| 29 | Read/write |
| 28–0 | Undefined |

Shift in command:

enable—Execute interface command on update-dr clear—Clears the CRC register read/write—Enable the CRC to respond to read (0) or write (1) accesses.

undefined—Undefined

The shifted out status bits are described below.

TABLE 8

| Bit | Shift out |
| --- | --- |
| 31–0 | CRC value |

Shift out status:

data—32-bit data word

Note: According to one embodiment, the CRC is shifted-out LSB first.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method comprising:

sending a first command to an interface coupled to a configurable system-on-a-chip from a tester;

blocking a next command execution;

executing the first command in the configurable system-on-a-chip;

writing a data output including a ready bit from the configurable system-on-a-chip to a memory register in the interface, the memory register having a variable length data field;

reading the data from the memory register, wherein the first bit read is an asserted ready bit.

2. A method as recited in claim 1, further comprising:

enabling the next command execution;

receiving the asserted ready bit in the tester;

sending a second command to the interface from the tester; and executing the second command in the configurable system-on-a-chip.

3. A method as recited in claim 2, further comprising, computing a data check sum.

4. A method as recited in claim 3, wherein the data check sum is computed for either data read or data writes.

5. A method as recited in claim 2, wherein the next command execution is enabled after the tester receives the asserted ready bit.

6. A method as recited in claim 1, wherein the memory register includes a bit chain.

7. A method as recited in claim 6, wherein the bit chain is a memory write command and has an address field, and a control field.

8. A method as recited in claim 7, wherein the control field includes a size of the variable length data field.

9. A method as recited in claim 7, wherein an internal address pointer is set to the address indicated by the address field and the variable length data is written into a memory portion of the configurable system-on-a-chip beginning at the internal address pointer.

10. A method as recited in claim 6, wherein the bit chain is a memory read command and has an unused field, an address field and a control field.

11. A method as recited in claim 10, wherein the control field includes a size.

12. A method as recited in claim 11, wherein an internal address pointer is set to the address indicated by the address field and data stored in a memory portion of the configurable system-on-a-chip beginning at the internal address pointer and continuing to a second address is then written to the memory register, wherein the second address is defined as the internal address pointer incremented by the size.

13. A method as recited in claim 6, wherein the bit chain is a memory read shift out and has the ready bit, and an unused field.

14. A method as recited in claim 1, wherein the variable length data field includes at least one of a group consisting of 8-bits, 16-bits and 32-bits.

15. A method as recited in claim 1, wherein the ready bit is shifted to the memory register upon a bus clock signal.

16. A method as recited in claim 15, wherein the ready bit is shifted from the memory register and the next command execution is enabled upon a clock signal from the tester.

17. A method as recited in claim 1, wherein reading the data from the memory register includes shifting one bit from the register.

18. A method as recited in claim 1, wherein the memory register in the interface is an auto-increment register.

19. A method as recited in claim 18, wherein the auto-increment register includes a bit chain.

20. A method as recited in claim 19, wherein the bit chain has the ready bit.

21. A method as recited in claim 20, wherein the bit chain generates an address by incrementing an internal address pointer by the number of bits in the variable length data field.

22. A method as recited in claim 18, further comprising, computing a data check sum.

23. A method as recited in claim 22, wherein the data check sum is computed for either data read or data writes.

24. An interface comprising:

a test data input;

a boundary scan register;

a bypass register; and an instruction register;

a memory register having a variable length data field, wherein the boundary scan register, the bypass register, the instruction register and the memory register are coupled in parallel; and a test data output, wherein the test data input is coupled to an input side of the registers and the test data output is coupled to an output side of the registers.

25. An interface as recited in claim 24, the memory register includes a capacity of at least 44 bits.

26. An interface as recited in claim 25, the memory register includes a capacity of 68 bits.

27. An interface as recited in claim 24, further comprising an auto-increment register coupled in parallel with the boundary scan register.

28. An interface as recited in claim 27, wherein the auto-increment register includes a capacity of at least 34 bits.

29. An interface as recited in claim 24, further comprising a fill register coupled in parallel with the boundary scan register.

30. An interface as recited in claim 29, wherein the fill register includes a capacity of at least 96 bits.

31. An interface as recited in claim 24, further comprising a cyclic redundancy check module.

32. An interface as recited in claim 31, wherein the cyclic redundancy check module includes a cyclic redundancy check register coupled in parallel with the boundary scan register.

33. An interface as recited in claim 32, wherein the cyclic redundancy check register includes a capacity of at least 32-bits.

34. A configurable system-on-chip comprising:

a central processing unit;

a breakpoint unit;

a DMA unit;

a memory unit;

a configurable system logic;

a test interface including:
  a test data input;
  a boundary scan register;
  a bypass register; and
  an instruction register;
  a fill register;
  an auto-increment register;
  a cyclic redundancy check register;
  a memory register having a variable length data field, wherein the boundary scan register, the bypass register, the instruction register, the memory register, the fill register, the auto-increment register and the cyclic redundancy check register are coupled in parallel; and
  a test data output, wherein the test data input is coupled to an input side of the registers and the test data output is coupled to an output side of the registers; and a system bus, wherein the central processing unit, the breakpoint unit, the DMA unit, the memory unit, the configurable system logic and the test interface are coupled to the system bus.

* * * * *